United States Patent
Sun et al.

(10) Patent No.: US 11,196,385 B2
(45) Date of Patent: Dec. 7, 2021

(54) SYSTEM AND METHOD OF IMPROVING BLOCKING IMMUNITY OF RADIO FREQUENCY TRANSCEIVER FRONT END

(71) Applicant: Silicon Laboratories Inc., Austin, TX (US)

(72) Inventors: Ruifeng Sun, Charlottesville, VA (US); Ricky Setiawan, Singapore (SG); Ben Wee-Guan Tan, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 115 days.

(21) Appl. No.: 16/793,985

(22) Filed: Feb. 18, 2020

(65) Prior Publication Data

US 2021/0257970 A1    Aug. 19, 2021

(51) Int. Cl.
*H03F 1/02* (2006.01)
*H03F 3/21* (2006.01)
*H03F 3/193* (2006.01)

(52) U.S. Cl.
CPC ........... *H03F 1/0205* (2013.01); *H03F 3/193* (2013.01); *H03F 3/211* (2013.01)

(58) Field of Classification Search
CPC .................................................. H03F 1/0205
See application file for complete search history.

(56) References Cited

U.S. PATENT DOCUMENTS

| | | | |
|---|---|---|---|
| 2008/0290911 A1* | 11/2008 | Williams | H03K 17/6872 327/109 |
| 2009/0289720 A1* | 11/2009 | Takinami | G05F 1/565 330/297 |
| 2013/0222064 A1* | 8/2013 | Kimball | H03F 3/24 330/253 |
| 2014/0009233 A1* | 1/2014 | Cabrera | H03F 3/72 330/273 |
| 2014/0062590 A1* | 3/2014 | Khlat | H03F 1/0227 330/127 |
| 2018/0254745 A1* | 9/2018 | Kovac | H03F 1/0222 |

* cited by examiner

*Primary Examiner* — Patricia T Nguyen
(74) *Attorney, Agent, or Firm* — Gary Stanford; Huffman Law Group, PC

(57) ABSTRACT

A power amplifier for a radio frequency transceiver including a driver, a disable circuit, and a bias circuit. The driver includes a source node for receiving a drive voltage when enabled and includes an output node that is susceptible to strong blocker signals when disabled. The bias circuit includes first and second bias nodes for driving the voltage level of the source and output nodes, respectively, to suitable bias voltage levels to minimize impact of blocker signals. The disable circuit includes switch circuits to couple the driver to the bias circuit in the disable mode. The bias circuit may include at least one voltage source. The bias circuit may be coupled to a supply voltage and may include a voltage divider coupled between the source and output nodes. The bias circuit may include a source-follower circuit to isolate the bias voltages from variations of the supply voltage.

20 Claims, 5 Drawing Sheets

SYSTEM AND METHOD OF IMPROVING BLOCKING IMMUNITY OF RADIO FREQUENCY TRANSCEIVER FRONT END

BACKGROUND OF THE INVENTION

Field of the Invention

The present invention relates in general to radio frequency communications, and more particularly to a system and method of improving blocking immunity of a front-end of an RF transceiver.

Description of the Related Art

Many different wireless radio frequency (RF) technologies may be used for several different applications operating in a common area, such as cellular networks, local area networks, home automation systems, Internet of Things (IoT), alarm systems, etc. The use of multiple wireless devices in a common area may cause communication conflicts when operating at the same frequency or within a common frequency range. Wireless technologies in the 2.4 Gigahertz (GHz) frequency range include Wi-Fi, Zigbee, Bluetooth (including low energy version or BLE), Thread, etc. Wireless technologies in the sub-GHz frequency range, such as 800-900 Megahertz (MHz), include some lower power Wi-Fi technologies (e.g., Mi-Wi), Z-wave, certain cellular communications (e.g., 3G, 4G, LTE), etc.

The performance of wireless RF transceivers of a lower powered wireless network tends to decrease when in close proximity to higher powered wireless RF transceivers of another network when operating at or near the same frequency or frequency range. A blocker signal (or blocker) is a strong signal transmitted at or near the frequency of operation of a transceiver by a device in a different network. Blocking immunity is a critical performance specification for receive mode operation. A blocker may be many orders-of-magnitude stronger than the desired signal at or near the same frequency. Due to the nonlinearity of the circuits and devices, the energy of a blocker may overlap with the signal thereby degrading the receive sensitivity or even completely corrupting the detection process. One example of such scenario is the co-existence of 2.4 GHz Bluetooth and Wi-Fi networks in which strong coincident Wi-Fi signals tend to block Bluetooth signals.

SUMMARY OF THE INVENTION

A power amplifier for a radio frequency transceiver according to one embodiment includes a driver, first, second and third switch circuits, and a bias circuit. The driver includes at least one P-channel transistor and at least one N-channel transistor having current terminals coupled between a source node and a supply ground node forming an intermediate output node. The first switch circuit couples a control input of the at least one N-channel transistor to the supply ground node in a disable mode, and the second switch circuit couples a control input of the at least one P-channel transistor to the source node in the disable mode. The bias circuit includes a first bias voltage node and a second bias voltage node, in which a voltage level of the second bias voltage node is greater than a voltage level of the supply ground node and in which a voltage level of the first bias voltage node is greater than the voltage level of the second bias voltage node in the disable mode. The third switch circuit couples the source node to the first bias voltage node and couples the intermediate output node to the second bias voltage node in the disable mode.

The voltage levels of the first and second bias voltage nodes are sufficient to minimize impact of a blocker signal detected at the intermediate output node when received by the radio frequency transmitter. In one embodiment, the first and second bias voltage nodes may be driven by one or more voltage sources. In another embodiment, the bias circuit includes a first bias resistor coupled between the first bias voltage node and the second bias node and includes a second bias resistor coupled between the second bias node and the supply ground node in the disable mode. At least one of the first and second bias resistors may be adjustable. In another embodiment, the bias voltage node may be coupled to receive a supply voltage.

In yet another embodiment, the bias circuit may include a source-follower circuit for driving the voltage level of the first bias voltage node during the disable mode. The bias circuit may further include a reference node, a current source that provides a reference current to the reference node in the disable mode, a reference resistor coupled between the reference node and the supply ground node in the disable mode, and a reference transistor having a control terminal coupled to the reference node, having a first current terminal coupled to a supply voltage and having a second current terminal coupled to the first bias voltage node in the disable mode. The reference resistor and/or at least one of the first and second bias resistors may be adjustable. The voltage level of the reference node may be adjusted to control the reference transistor to drive the first bias voltage node to a voltage level that is sufficient to minimize impact of a blocker signal received by the radio frequency transceiver and detected at the intermediate output node.

A method of disabling a power amplifier of a radio frequency transceiver, the power amplifier including at least one P-channel transistor and at least one N-channel transistor having current terminals coupled between a source node and a supply ground node forming an intermediate output node according to one embodiment includes coupling a control input of the at least one N-channel transistor to the supply ground node in a disable mode, coupling a control input of the at least one P-channel transistor to the source node in the disable mode, coupling the source node to a first bias voltage node having a voltage level that is greater than a voltage level of the supply ground node in the disable mode, and coupling the intermediate output node to a second bias voltage node having a voltage level that is between the voltage levels of the first bias voltage node and the supply ground node in the disable mode.

The method may include charging the first and second bias voltage nodes during the disable mode to corresponding voltage levels that are sufficient to minimize impact of a blocker signal detected at the intermediate output node when received by the radio frequency transmitter. The method may include coupling a first bias resistor between the first bias voltage node and the second bias voltage node and coupling a second bias resistor between the second bias voltage node and the supply ground node in the disable mode. The method may include coupling the first bias voltage node to receive a supply voltage in the disable mode. The method may include adjusting at least one of the first and second bias resistors to select a voltage level of the intermediate output node in the disable mode.

The method may include coupling a first bias resistor between the first bias voltage node and the second bias voltage node and coupling a second bias resistor between the second bias voltage node and the supply ground node in the disable mode, providing a reference current to a reference node and coupling a reference resistor between the reference node and the supply ground node in the disable mode, and providing a source-follower transistor that is controlled by a voltage level of the reference node to control a voltage level of the first bias voltage node in the disable mode. The method may include adjusting the reference resistor to select a voltage level of the reference node in the disable mode. The method may include adjusting at least one of the first and second bias resistors to select a voltage level of the intermediate output node in the disable mode. The method may include adjusting the voltage level of the reference node to control the reference transistor to drive the first and second bias voltage nodes to corresponding voltage levels sufficient to minimize impact of a blocker signal received by the radio frequency transceiver and detected at the intermediate output node.

The method may include receiving an enable signal indicative of the disable mode, removing a drive voltage from the source node when the enable signal indicates the disable mode, and controlling the coupling of the control terminals of the at least one N-channel transistor and the at least one P-channel transistor based on the enable signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the issues associated with strong blockers in co-located or nearby wireless networks. A lower powered radio frequency (RF) transceiver needs sufficient blocking immunity to capture a desired signal in the presence of a strong nearby coincident blocker. An RF attenuator may be placed in front of the receiver front-end to combat the interference caused by blockers. When the strength of a blocker becomes sufficiently large, however, the blocking level of the RF attenuator may be reduced to correctly detect the desired signal. Nonetheless, nonlinear devices in the output stage of the power amplifier (PA) sharing a common antenna connection point may become a dominant factor further limiting reception performance of the transceiver. As described further herein, the output stage of the PA is modified with a bias circuit to reduce or eliminate the nonlinear impact of the PA when disabled, thereby improving the blocking immunity of the transceiver front-end.

Figure 1:
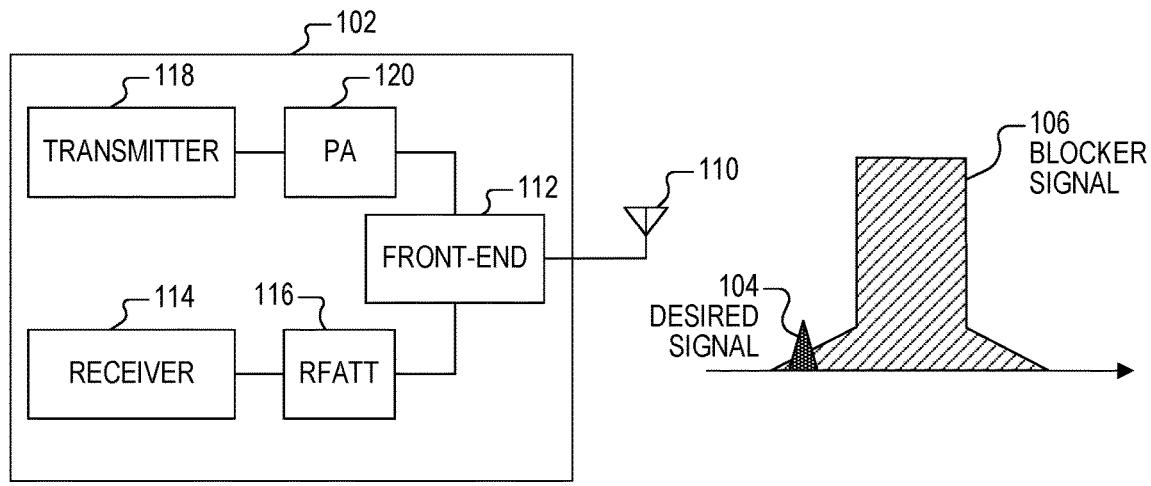
FIG. 1 is a simplified block diagram of an RF transceiver attempting to receive a desired signal in the presence of a strong blocker signal.

FIG. 1 is a simplified block diagram of an RF transceiver 102 attempting to receive a desired signal 104 in the presence of a strong blocker signal 106. The desired signal 104 (darker shading) and blocker signal 106 (lighter shading) are not drawn to any particular scale but nonetheless show relative amplitudes plotted versus frequency to illustrate relative strength and frequency between the signals. Generally, the blocker signal 106 is much stronger having frequency components that overlap the frequency range of the desired signal 104. In one embodiment, for example, the RF transceiver 102 may be implemented according 2.4 Gigahertz (GHz) Bluetooth in which the desired signal 104 is transmitted in the 2.4 GHz frequency range. The blocker signal 106 is a 2.4 GHz Wi-Fi signal that overlaps the frequency range of the Bluetooth signal. The strength of the desired signal 104 may be on the order of −60 to −70 dBm (decibels referenced to 1 milliwatt), whereas the Wi-Fi signal is significantly stronger, such as on the order of about 0 dBm.

The RF transceiver 102 includes an external antenna 110 coupled to a front-end circuit 112, which is further coupled to a receiver circuit 114 that is configured to detect and receive the desired signal 104. The antenna 110 and the front-end circuit 112 are also exposed to the blocker signal 106 which may tend to overwhelm the desired signal 104. For this reason, an RF attenuator (RFATT) 116 is interposed between the front-end circuit 112 and the receiver circuit 114 in an attempt to attenuate the blocker signal 106 while allowing a sufficient amount of energy of the desired signal 104 to pass to the receiver circuit 114. The RF transceiver 102 also includes a transmitter circuit 118 that develops a transmit signal (not shown) provided to an input of a power amplifier (PA) 120, which amplifies the transmit signal for transmission by the antenna 110. The output of the PA 120 is also coupled to the front-end circuit 112. When the RF transceiver 102 is not transmitting, the PA 120 is turned off to allow the receiver circuit 114 to detect and receive signals in the wireless medium, such as, for example, the desired signal 104.

Figure 2:
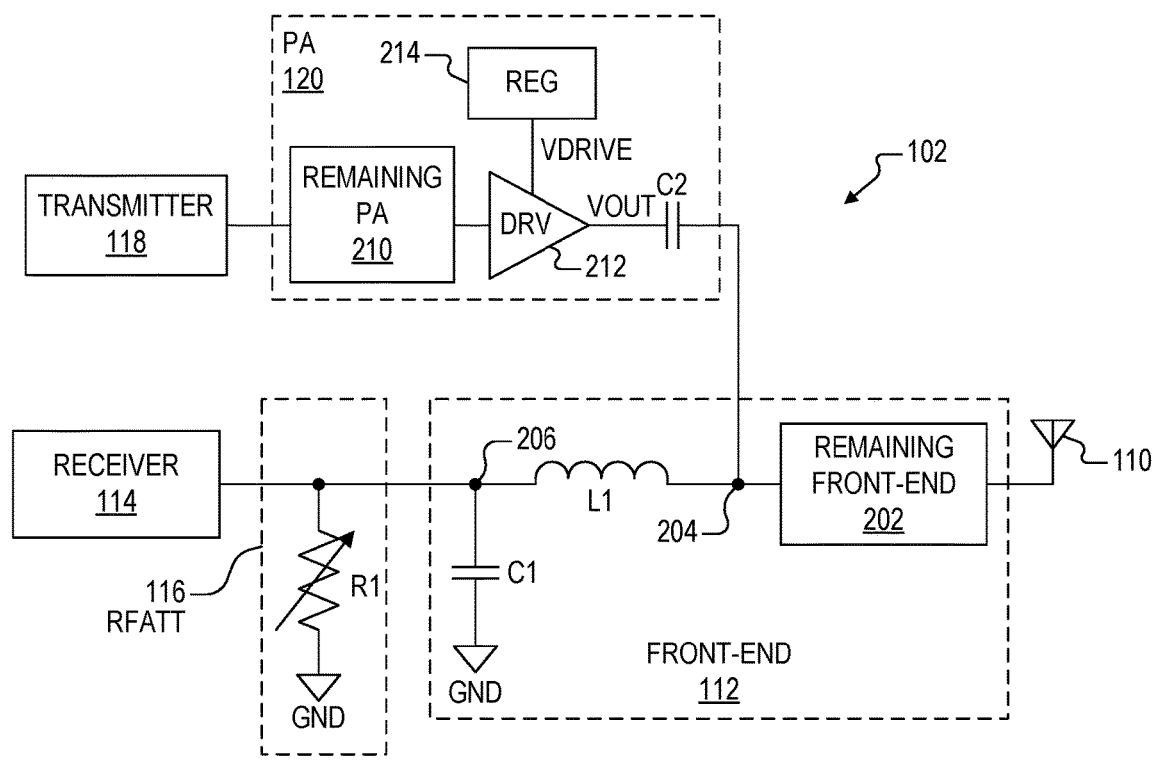
FIG. 2 is a more detailed block diagram of the RF transceiver of FIG. 1 according to one embodiment of the present disclosure.

FIG. 2 is a more detailed block diagram of the RF transceiver 102 according to one embodiment of the present disclosure. The front-end circuit 112 includes a capacitor C1, an inductor L1, and remaining Front-End circuitry 202. The antenna 110 is coupled to one end of the remaining Front-End circuitry 202, which generally includes any additional circuitry of the front-end circuit 112 including, for example, a matching network or the like. The other end of the remaining Front-End circuitry 202 is coupled to a common RF node 204 which is further coupled to one end of the inductor L1. The other end of the inductor L1 is coupled to a node 206, which is coupled to one end of the capacitor C1 and to the input of the receiver circuit 114. The other end of the capacitor C1 is coupled to a supply reference node such as ground (GND). The RFATT 116 is depicted as an adjustable resistor R1 coupled between node 206 and GND. The RFATT 116 may be configured as a resistor network with switches for selecting resistances of the resistor network to adjust the resistance of R1.

The output of the transmitter circuit 118 is provided to an input of remaining PA circuitry 210 of the PA 120, in which the remaining PA circuitry 210 has an output coupled to an input of a driver 212 having an output providing an output voltage VOUT. The driver 212 has an output provided through a capacitor C2 to the common RF node 204. A regulator 214 provides a drive voltage VDRIVE for enabling the driver 212. The remaining PA circuitry 210 generally includes any additional circuitry of the PA 120 such as, for example, filter circuitry and/or conditioning circuitry or the like.

The blocker signal 106 may impede the ability of the receiver circuit 114 from successfully receiving the desired signal 104. The resistance of the resistor R1 of the RFATT may be reduced to add more attenuation in an attempt to reduce the received strength of the blocker signal 106 to enable successful reception of the desired signal 104. The PA 120, however, is not protected from the blocker signal 106 in the same manner. As further described herein, when the PA 120 is configured in a conventional manner, the blocker signal 106 interacts with nonlinear devices within the PA 120 causing interference that is effectively amplified by the front-end circuit 112 and the RFATT 116 and provided to the receiver circuit 115. The additional interference significantly reduces the ability of the receiver circuit 114 to successfully receive the desired signal 104.

Figure 3:
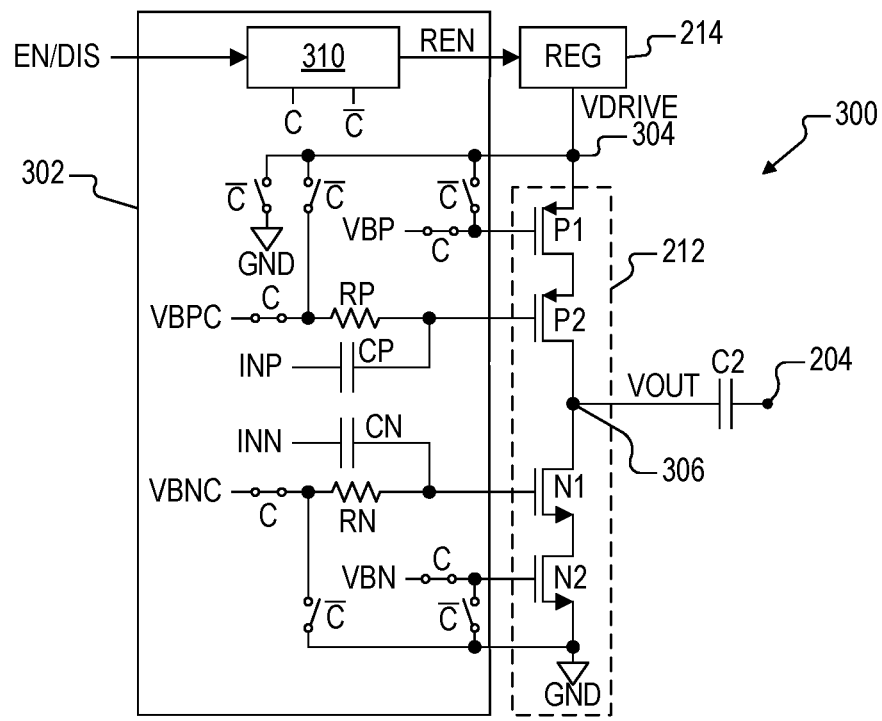
FIG. 3 is a more detailed schematic and block diagram of a power amplifier circuit including a disable circuit implemented according to a conventional configuration.

FIG. 3 is a more detailed schematic and block diagram of a power amplifier (PA) circuit 300 including a disable circuit 302 implemented according to a conventional configuration. The PA circuit 300 includes the regulator 214 providing VDRIVE to the driver 212 via a source node 304. The driver 212 includes a first P-channel transistor P1 having a source terminal coupled to the source node 304 and having a drain terminal coupled to a source terminal of a second P-channel transistor P2. P2 has a drain terminal coupled to an intermediate output node 306 developing the voltage VOUT, which is further coupled to a drain terminal of a first N-channel transistor N1. N1 has a source terminal coupled to a drain terminal of another N-channel transistor N2 having its source terminal coupled to GND. The intermediate output node 306 forms the output of the driver 212 coupled to one end of the capacitor C2 which has its other end coupled to the common RF node 204.

The P-channel and N-channel transistors described herein, including P1, P2, N1, and N2, may be implemented in any suitable manner, such as MOS-type transistors including PMOS and NMOS devices, field-effect transistors (FETs) including P-type or N-type transistors, insulated-gate FETs (IGFETs), bipolar-junction transistors (BJTs), etc. The disable circuit 302 includes a switch control circuit 310 receiving an enable/disable (EN/DIS) signal and providing a regulator enable (REN) signal to enable or disable the regulator 214. The EN/DIS signal has a first logic state for an enable (EN) mode of the PA 120 and has a second logic state for a disable (DIS) mode of the PA 120.

When the driver circuit 300 is used within the PA 120 shown in FIG. 1, the EN/DIS effectively enables or disables the regulator 214 and the driver 212 of the PA 120 depending upon the logic state of EN/DIS. When the EN/DIS signal is asserted to its first logic state for the enable mode of the PA 120, REN is asserted to enable the regulator 214 to provide VDRIVE to also enable the driver 212. When the EN/DIS signal is asserted to its second logic state for the disable mode of the PA 120, REN is asserted to disable the regulator 214 and remove VDRIVE from the driver 212. The switch control circuit 310 also provides first and second switch control signals C and $\overline{C}$, in which the logic states of C and $\overline{C}$ are controlled by the EN/DIS signal and are asserted to opposite logic states with respect to each other. In one embodiment, for example, the C control signal may be in a first logic state (or vice-versa) while the $\overline{C}$ signal may be in a second logic state (or vice-versa) when the EN/DIS signal is asserted to its first logic state, and the C control signal may be in the second logic state (or vice-versa) while the $\overline{C}$ signal may be in the first logic state (or vice-versa) when the EN/DIS signal is asserted to its second logic state.

The disable circuit 302 includes multiple single-pole, single-throw (SPST) switches that are each controlled by either C or $\overline{C}$ for opening or closing the respective switches. Although the particular configuration of the C and $\overline{C}$ switches are not shown, any suitable switch configuration is contemplated, such as using PMOS and/or NMOS transistors, CMOS-based transmission gates, BJT switches, etc. FIG. 3 illustrates the case in which EN/DIS is asserted to its first logic state to enable the regulator 214 and to enable driver 212 using the disable circuit 302. As shown in FIG. 3, the C switches are closed and the $\overline{C}$ switches are opened when EN/DIS is asserted to its first logic state. The PA 120 includes or otherwise receives bias signals VBP, VBPC, VBN, VBNC, and a pair of transmit signals INP and INN. When enabled, the regulator 214 is enabled to provide VDRIVE across the driver 212 referenced to GND. Also, VBP is provided to the gate terminal of P1, VBPC is provided through a resistor RP to the gate terminal of P2, INP is provided through a capacitor CP to the gate terminal of P2, INN is provided through a capacitor CN to the gate terminal of N1, VBNC is provided through a resistor RN to the gate terminal of N1, and VBN is provided to the gate terminal of N2. If the PA circuit 300 is used within the PA 120, then when the RF transceiver 102 is ready to transmit a signal, the transmitter circuit 118 develops the INP and INN transmit signals and the EN/DIS signal is asserted to enable the PA 120.

Although the present disclosure is not limited to specific voltages and voltage levels, in one embodiment VDRIVE may be about 1.6 Volts (V), VBP may be about 0.3V, VBPC may be about 0.9V, VBNC may be about 0.6V, and VBN may be about 1.3V. Alternative voltages are contemplated in different configurations.

If the PA circuit 300 is used within the PA 120 and the RF transceiver 102 is not transmitting a signal, then the EN/DIS signal is asserted to its second logic state to disable the regulator 214 and the driver 212. When EN/DIS is asserted to its second logic state, the C switches are opened, the $\overline{C}$ switches are closed and the regulator 214 is disabled by the REN signal so that VDRIVE is not provided or is otherwise open-circuited. When the C switches are opened, the VBP, VBPC, INP, INN, VBNC, and VBN signals are removed or otherwise disconnected from the driver 212. When the $\overline{C}$ switches are closed, the gate terminal of P1 is coupled to the source node 304 which is coupled to GND, the end of the resistor RP otherwise receiving VBPC is instead coupled to GND via the source node 304, the gate terminal of N2 is coupled to GND, and the other end of the resistor RN otherwise receiving VBNC is instead coupled to GND.

Figure 4:
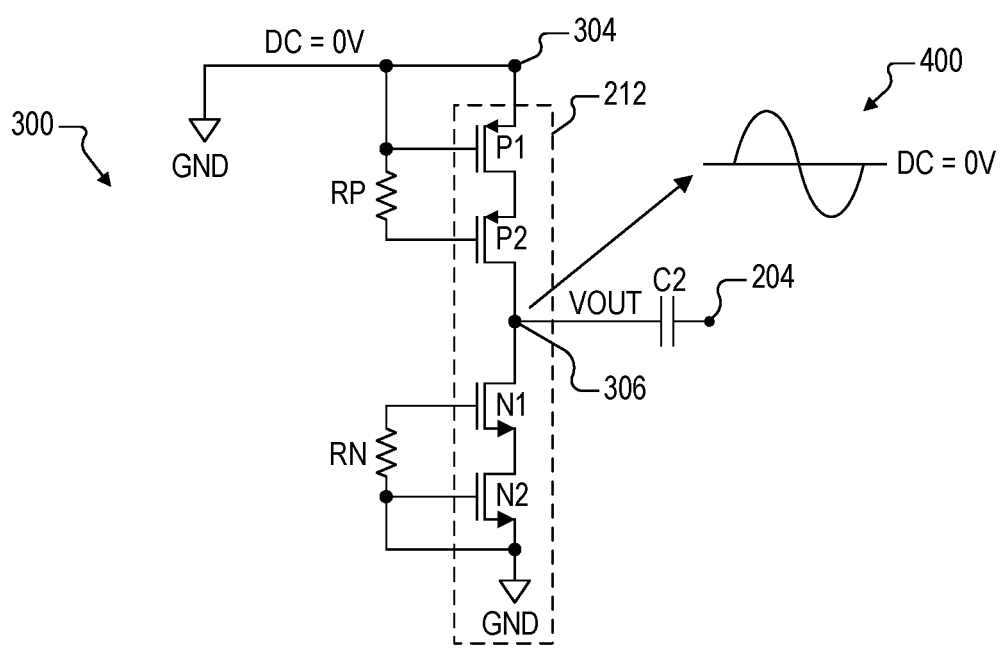
FIG. 4 is a schematic diagram illustrating an electrical equivalent of the power amplifier circuit of FIG. 3 when used in the power amplifier of FIG. 1 and when an enable signal is asserted to disable the driver of the power amplifier for a conventional configuration.

FIG. 4 is a schematic diagram illustrating an electrical equivalent of the PA circuit 300 when used in the PA 120 and when EN/DIS is asserted to disable the regulator 214 and the driver 212 for the conventional configuration. The gate and source terminals of P1 are coupled to the source node 304 which is coupled to GND. The gate terminal of P2 is effectively coupled to GND through the resistor RP. The gate and source terminals of N2 are coupled to GND, and the gate terminal of N2 is effectively coupled to GND through the resistor RN.

Since the driver 212 is effectively disabled, it might appear that the PA 120 is effectively removed from the RF transceiver 102. The blocker signal 106 is depicted in a graph 400 as a sinusoidal signal at the intermediate output node 306. Since the driver 212 is grounded, intermediate output node 306 is referenced to about 0V. When the sinusoidal signal representing a strong blocker goes positive every cycle, it tends to cause P1 and P2 to conduct current. For example, when P1 and P2 are configured as PMOS transistors, the positive voltage at the intermediate output node 306 tends to push P1 and P2 at least into their subthreshold regions, so that P1 and P2 become conductive instead of remaining in their off states. In particular, if the signal swing at the intermediate output node 306 is at or above the corresponding PMOS threshold level VTH_P of P1 and P2, then P1 and P2 may enter their subthreshold or active region of operation and may thus become conductive.

In addition, when the sinusoidal signal goes negative every cycle, it tends to cause N1 and N1 to conduct current. For example, when N1 and N2 are configured as NMOS transistors, the negative voltage at the intermediate output node 306 tends to push N1 and N2 at least into their subthreshold regions, so that N1 and N2 become conductive instead of remaining in their off state. In particular, if the signal swing at the intermediate output node 306 is at or below the corresponding NMOS threshold level VTH_N of N1 and N2, then N1 and N2 may enter their subthreshold or active region of operation and may thus become conductive.

In this manner, the nonlinear devices P1, P2, N1 and N2 of the driver 212 interact with the blocker signal 106 thereby negatively impacting the received signal on the common RF node 204 when the PA circuit 300 using the disable circuit 302 is used in the PA 120. When the RF transceiver 102 is attempting to receive the desired signal 104 and adjusts the RFATT 116 in an attempt to attenuate the blocker signal 106, then the partial activation of any one or more of the nonlinear transistor devices P1, P2, N1 and N2 of the driver 212 disabled by the disable circuit 302 interferes with operation of the receiver circuit 114. In summary, when the blocker signal 106 is sufficiently strong, inference by the driver 212 disabled by the disable circuit 302 may prevent the receiver circuit 114 from successfully receiving the desired signal 104.

Figure 5:
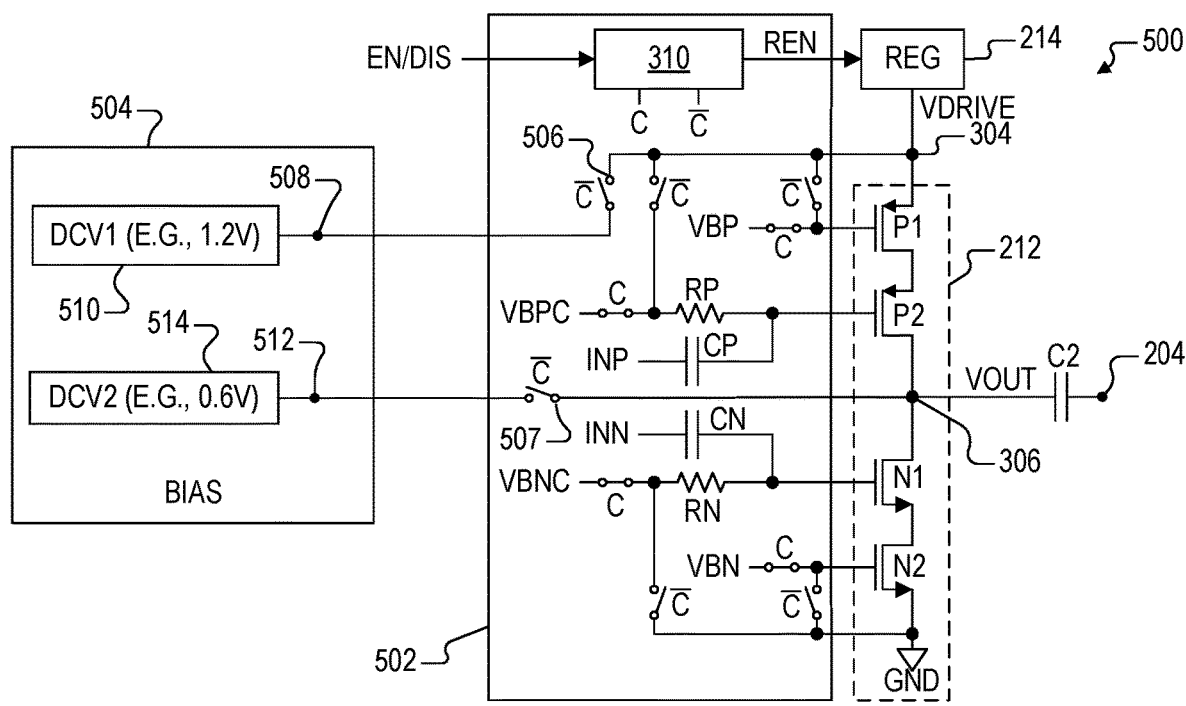
FIG. 5 is a schematic and block diagram of a power amplifier circuit including a disable circuit and a bias circuit implemented according to one embodiment of the present disclosure.

FIG. 5 is a schematic and block diagram of a PA circuit 500 including a disable circuit 502 and a bias circuit 504 implemented according to one embodiment of the present disclosure. The disable circuit 302 is replaced by the disable circuit 502 and the bias circuit 504 is added, in which the disable circuit 502 and the bias circuit 504 collectively minimize interference of the driver 212 in the disable mode. The regulator 214 providing the drive voltage VDRIVE and the driver 212 are included and coupled to operate in substantially the same manner as shown and described for the PA circuit 300. The disable circuit 502 is substantially similar to the disable circuit 302 and includes similar components having similar reference numerals. The disable circuit 502 includes the switch control circuit 310 receiving the EN/DIS signal, providing the REN signal to enable or disable the regulator 214, and providing the switch control signals C and $\overline{C}$ in the same manner as previously described.

The $\overline{C}$ switch that couples the source node 304 to GND in the disable mode, however, is replaced by a similar $\overline{C}$ switch 506 that couples the source node 304 to a first bias voltage node 508 of the bias circuit 504 in the disable mode rather than to GND. In addition, another $\overline{C}$ switch 507 is added to couple the intermediate output node 306 to a second bias voltage node 512 in the bias circuit 504.

The bias circuit 504 may include a first voltage source 510 that develops or otherwise provides a first DC voltage (DCV1) to the bias voltage node 508, and may include a second voltage source 514 that develops or otherwise provides a second DC voltage (DCV2) to the bias voltage node 512. The configuration of the bias circuit 504 and/or the voltage sources 510 and 514 depends upon the particular implementation. In one embodiment, for example, the bias circuit 504 may include conductive connections to any suitable nodes in the RF transceiver 102 having the desired voltage levels DCV1 and DCV2. In another embodiment, the voltage sources 510 and 514 of the bias circuit 504 may each include a buffer, a voltage divider or an amplifier or the like that converts a supply voltage VDD or other available DC voltage by the appropriate amount to the desired voltage levels DCV1 and DCV2.

The disable circuit 502 operates in substantially the same manner as the disable circuit 302 previously described in the enable mode. In particular, when the PA circuit 500 is used in the PA 120 and when the EN/DIS signal is asserted to its first logic state to enable the PA 120, then the regulator 214 is enabled to provide VDRIVE to the driver 212, VBP is provided to the gate terminal of P1, VBPC is provided through the resistor RP to the gate terminal of P2, INP is provided through the capacitor CP to the gate terminal of P2, INN is provided through the capacitor CN to the gate terminal of N1, VBNC is provided through the resistor RN to the gate terminal of N1, and VBN is provided to the gate terminal of N2. The $\overline{C}$ switch 506 removes DCV at the bias voltage node 508 from the source node 304. If the PA circuit 500 is used within the PA 120, then when the RF transceiver 102 is ready to transmit a signal, the transmitter circuit 118 develops the INP and INN transmit signals and the EN/DIS signal is asserted to enable the PA 120.

When the PA circuit 500 is used within the PA 120 and the RF transceiver 102 is not transmitting a signal, then the EN/DIS signal is asserted to its second logic state to disable the regulator 214 and the driver 212. When EN/DIS is asserted to its second logic state, the C switches are opened, the $\overline{C}$ are closed and the regulator 214 is disabled by the REN signal so that VDRIVE is not provided or is otherwise open-circuited. When the C switches are opened, the VBP, VBPC, INP, INN, VBNC, and VBN signals are removed or otherwise disconnected from the driver 212. When the $\overline{C}$ switches are closed, the gate terminal of P1 is coupled to the source node 304, the end of the resistor RP otherwise receiving VBPC is instead coupled to the source node 304, the gate terminal of N2 is coupled to GND, and the other end of the resistor RN otherwise receiving VBNC is instead coupled to GND. In this case, however, the $\overline{C}$ switch 506 couples the source node 304 to the bias voltage node 508 developing the voltage level DCV1, and the $\overline{C}$ switch 507 couples the intermediate output node 306 to the bias voltage node 512 developing the voltage level DCV2.

Figure 6:
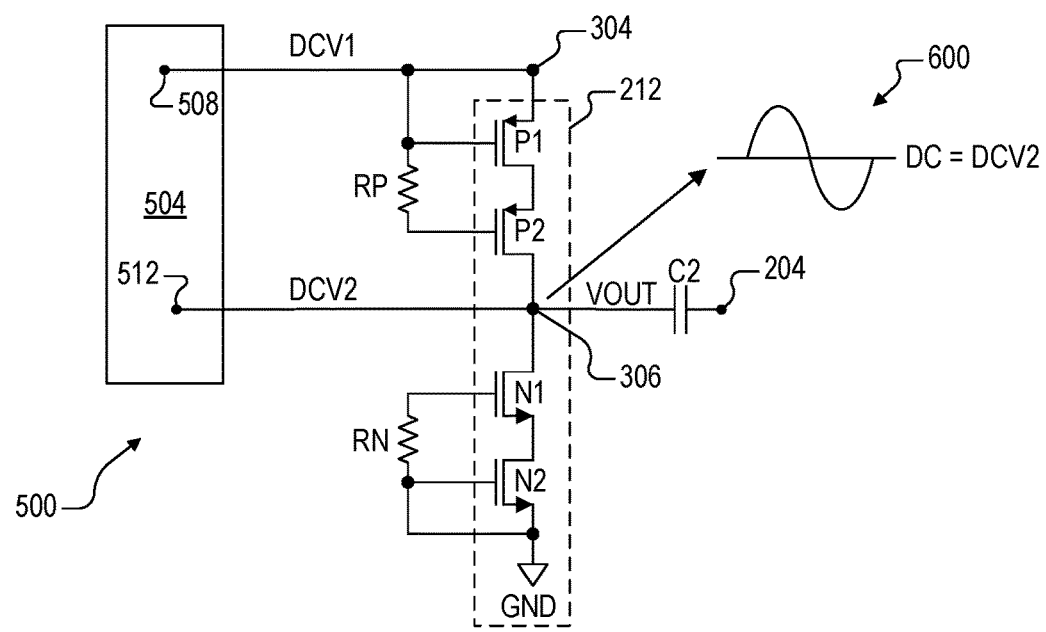
FIG. 6 is a schematic diagram illustrating an electrical equivalent of the power amplifier circuit of FIG. 5 when used in the power amplifier of FIG. 1 and when an enable signal is asserted to disable the regulator and driver of the power amplifier according to one embodiment of the present disclosure.

FIG. 6 is a schematic diagram illustrating an electrical equivalent of the PA circuit 500 when used in the PA 120 and when EN/DIS is asserted to disable the regulator 214 and the driver 212 according to one embodiment of the present disclosure. The gate and source terminals of P1 are coupled to the source node 304 which is coupled to the bias voltage node 508 developing the voltage level DCV1 from the bias circuit 504. The gate terminal of P2 is effectively coupled to DCV1 through the resistor RP. The intermediate output node 306 is coupled to DCV2. The gate and source terminals of N2 are coupled to GND, and the gate terminal of N1 is effectively coupled to GND through the resistor RN. The blocker signal 106 at the intermediate output node 306 is represented a sinusoidal signal depicted in a graph 600. Since the intermediate output node 306 is coupled to DCV2, it has a DC reference level of DCV2 which is greater than GND but less than DCV1. In one embodiment, DCV2 is at or substantially close to DCV1/2. In this case, when the sinusoidal signal goes positive every cycle, P1 and P2 remain substantially off, and when the sinusoidal signal goes negative every cycle, N1 and N2 remain substantially off.

In this manner, if the PA circuit 500 is used in the PA 120 and the disable circuit 502 and the bias circuit 504 are used to disable the driver 212, then the nonlinear devices P1, P2, N1, and N2 are only minimally impacted by the blocker signal 106 and thus do not substantially impact the received signal on the common RF node 204. When the RF transceiver 102 is attempting to receive the desired signal 104 and adjusts the RFATT 116 to attenuate the blocker signal 106, the nonlinear devices P1, P2, N1 and N2 of the driver 212 of the PA 120 remain substantially off and may only minimally interfere with operation of the receiver circuit 114. When the blocker signal 106 is sufficiently strong, operation of the RFATT 116 to attenuate the blocker signal 106 enables the receiver circuit 114 to have a significantly greater chance of receiving the desired signal 104 as compared to a conventional configuration.

In summary, to prevent the nonlinear devices of the PA 120 from becoming conductive and causing linearity degradation, the source and intermediate output nodes 304 and 306 of the PA 120 are biased to proper levels using the bias circuit 504 providing the bias voltages DCV1 and DCV2. The peak level of the signal swing at the intermediate output node 306 has to be at least DCV2+|VTH_P| or more for the nonlinear devices P1 and P2 of the driver 212 to begin conducting, where |VTH_P| is the absolute value of the threshold voltage level for PMOS transistors P1 and P2. Similarly, the peak level of the signal swing at the intermediate output node 306 has to be at least −(DCV2+|VTH_N|) or less for the nonlinear devices N1 and N2 of the driver 212 to begin conducting, where |VTH_N| is the absolute value of the threshold voltage level for NMOS transistors N1 and N2.

It is noted that in low power applications, the PA circuit 500 may consume a small amount of additional current in the form of dedicated biasing current or leakage current. Nonetheless, this may be an acceptable trade-off considering a substantial improvement in blocking performance. It is noted, for example, that the maximum power consumption of the receiver circuit 114 is typically when it is at its maximum gain setting, when, for instance, its internal low-noise amplifier (LNA) (not shown) consumes its maximum current to maximize the gain to receive the weakest signal. In a blocking scenario, especially when a very strong blocker signal 106 is present, the LNA and other gain stages in the receiver circuit 114 (not shown) are already backed off in terms of gain and current consumption. So the overall current consumption, including any extra current caused by the disable circuit 502 and the bias circuit 504, is still lower than the maximum current of the receiver circuit 114.

In an alternative embodiment to potentially reduce power consumption, if desired, the bias voltage node 506 may initially be coupled to GND and the output voltage node 306 remain open-circuited when the PA 120 is disabled and the gain of the receive circuit 114 is high to receive weaker signals. When the gain of the receive circuit 114 is backed off by a relatively large threshold amount to attenuate gain in the presence of a strong blocker signal, such as the blocker signal 106, the bias voltage node 506 may be switched to DCV1 and the bias voltage node 512 may be switched to DCV2 from the bias circuit 504. Alternatively, or in addition, the switch to the bias voltages DCV1 and DCV2 may be predicated on control of the RFATT 116. For example, when the RFATT 116 is adjusted in an attempt to attenuate a strong blocker signal 106, the bias voltage node 506 may be switched from GND to DCV1 and the bias voltage node switched to DCV2 to avoid interference by the driver 212.

The specific voltage levels of DCV1 and DCV2 depends upon the particular configuration and selection of the devices P1, P2, N1, and N2 of the driver 212 and the expected maximum voltage swing of the intermediate output node 306 in the presence of strong blocker signals. In one embodiment, for example, DCV1 may be about 1.2V and DCV2 may be about 0.6V, although alternative bias voltage levels are contemplated.

Figure 7:
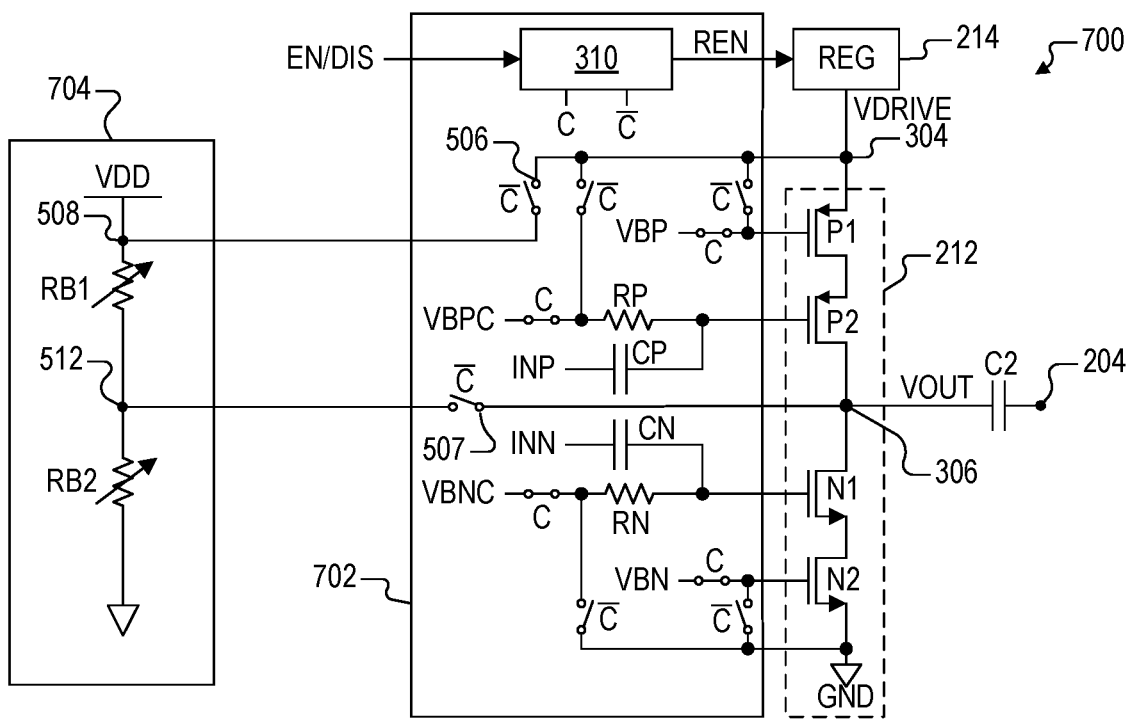
FIG. 7 is a schematic and block diagram of a power amplifier circuit including a disable circuit and a bias circuit implemented according to another embodiment of the present disclosure.

FIG. 7 is a schematic and block diagram of a PA circuit 700 including a disable circuit 702 and a bias circuit 704 implemented according to another embodiment of the present disclosure. The disable circuit 302 is replaced by the disable circuit 702 and the bias circuit 504 is replaced by a bias circuit 704, in which the disable circuit 702 and the bias circuit 704 collectively minimize interference of the driver 212 in the disable mode. The regulator 214 providing the drive voltage VDRIVE and the driver 212 are included and coupled to operate in substantially the same manner as shown and described for the PA circuit 500. The disable circuit 702 is substantially similar to the disable circuit 502 and includes similar components having similar reference numerals. The disable circuit 702 includes the switch control circuit 310 receiving the EN/DIS signal, providing the REN signal to enable or disable the regulator 214, and providing the switch control signals C and $\overline{C}$ in the same manner as previously described. The $\overline{C}$ switch 506 is included to couple the source node 304 to the bias voltage node 508 of the bias circuit 704 in the disable mode in a similar manner as described for the disable circuit 502. Also, the $\overline{C}$ switch 507 is included to couple the intermediate output node 306 to the bias voltage node 512 of the bias circuit 704 in the disable mode in a similar manner as described for the disable circuit 502.

The bias voltage node 508 in the bias circuit 704 is coupled to the supply voltage VDD. The bias circuit 704 further includes a first bias resistor RB1 coupled between the bias voltage node 508 and the bias voltage node 512, and a second bias resistor RB2 coupled between the bias voltage node 512 and GND. Although not shown, the bias circuit 704 may further include one or more $\overline{C}$ switches to selectively decouple the bias resistors RB1 and RB2 from VDD when the PA 120 is enabled.

The disable circuit 702 operates in substantially the same manner as the disable circuit 502 previously described in the enable mode. In particular, when the PA circuit 700 is used in the PA 120 and when the EN/DIS signal is asserted to its first logic state to enable the PA 120, then the regulator 214 is enabled to provide VDRIVE to the driver 212, VBP is provided to the gate terminal of P1, VBPC is provided through the resistor RP to the gate terminal of P2, INP is provided through the capacitor CP to the gate terminal of P2, INN is provided through the capacitor CN to the gate terminal of N1, VBNC is provided through the resistor RN to the gate terminal of N1, and VBN is provided to the gate terminal of N2. The $\overline{C}$ switch 506 removes VDD at the bias voltage node 508 from the source node 304 and the $\overline{C}$ switch 507 decouples the bias voltage node 512 from the intermediate output node 306. If the PA circuit 700 is used within the PA 120, then when the RF transceiver 102 is ready to transmit a signal, the transmitter circuit 118 develops the INP and INN transmit signals and the EN/DIS signal is asserted to enable the PA 120.

When the PA circuit 700 is used within the PA 120 and the RF transceiver 102 is not transmitting a signal, then the EN/DIS signal is asserted to its second logic state to disable the regulator 214 and the driver 212. When EN/DIS is asserted to its second logic state, the C switches are opened, the $\overline{C}$ are closed and the regulator 214 is disabled by the REN signal so that VDRIVE is not provided or is otherwise open-circuited. When the C switches are opened, the VBP, VBPC, INP, INN, VBNC, and VBN signals are removed or otherwise disconnected from the driver 212. When the $\overline{C}$ switches are closed, the gate terminal of P1 is coupled to the source node 304, the end of the resistor RP otherwise receiving VBPC is instead coupled to the source node 304, the gate terminal of N2 is coupled to GND, and the other end of the resistor RN otherwise receiving VBNC is instead coupled to GND. In addition, the $\overline{C}$ switch 506 couples the source node 304 to the bias voltage node 508 receiving VDD and the $\overline{C}$ switch 507 couples the intermediate output node 306 to the bias voltage node 512.

The resistors RB1 and RB2 form a voltage divider for dividing the voltage level of VDD at the bias voltage node 508 to a suitable bias voltage level at the bias voltage node 512 for the intermediate output node 306 when the driver 212 is disabled by the disable circuit 702. The resistors RB1 and RB2 may be adjustable as shown for selecting a desired voltage level of the intermediate output node 306 when the PA 120 is disabled.

Figure 8:
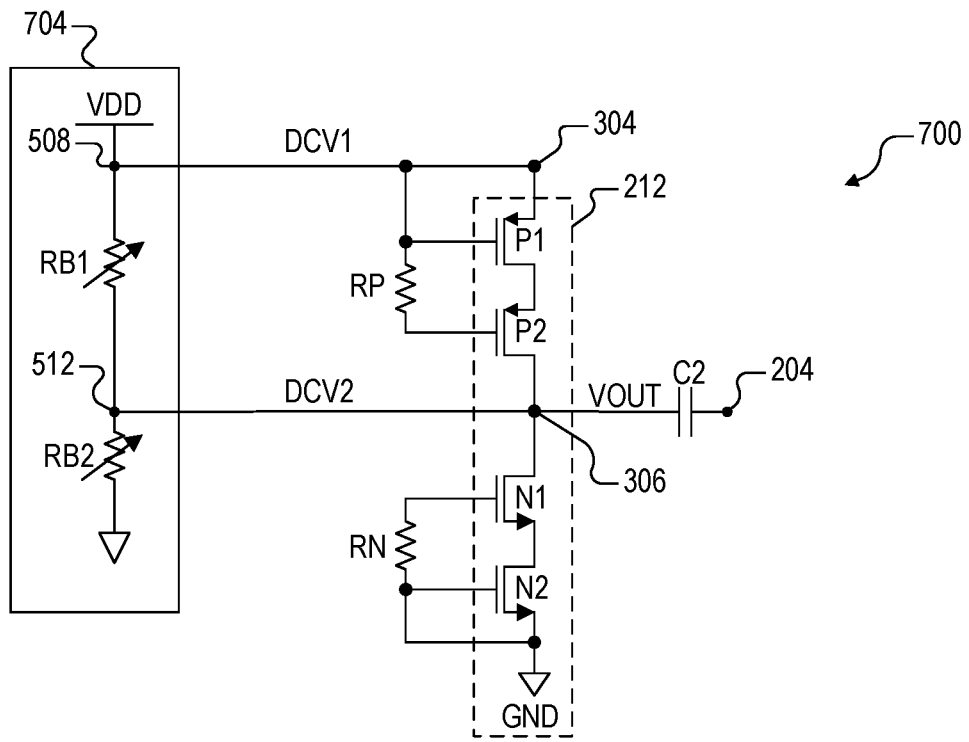
FIG. 8 is a schematic diagram illustrating an electrical equivalent of the power amplifier circuit of FIG. 7 when used in the power amplifier of FIG. 1 and when an enable signal is asserted to disable the driver of the power amplifier according to one embodiment of the present disclosure.

FIG. 8 is a schematic diagram illustrating an electrical equivalent of the PA circuit 700 when used in the PA 120 and when EN/DIS is asserted to disable the driver 212 according to one embodiment of the present disclosure. Operation of the PA circuit 700 is substantially similar to operation of the PA circuit 500 previously described. The gate terminal N2 is grounded and the gate terminal of N1 is pulled to GND through the resistor RN. The source and gate terminals of P1 are coupled to the source node 304 which is driven to the voltage level of VDD. The gate terminal of P2 is also pulled to VDD via the resistor RP. The resistors RB1 and RB2 are adjusted or otherwise configured to drive the nominal voltage level of the intermediate output node 306 to a suitable bias voltage greater than 0V at the bias voltage node 512, such as a voltage level similar to DCV/2. Again, the driver 212 is effectively disabled and effectively removed from the RF transceiver 102. Also, the nonlinear devices P1, P2, N1, and N2 remain substantially off unless the peak levels of the blocker signal 106 exceed a relatively high threshold voltage level. In this manner as with the PA circuit 500, the PA circuit 700 enables the receiver circuit 114 to have a significantly greater chance of receiving the desired signal 104 as compared to a conventional configuration.

It is noted that if the supply voltage VDD has a relatively large variation, which may be the case for certain mobile devices, then the biasing levels at the source and intermediate output nodes 304 and 306 may also vary significantly when using the PA circuit 700 in the PA 120. In addition, the PA circuit 700 may incur a certain amount current consumption, including leakage current, which may also vary significantly with variations of VDD.

Figure 9:
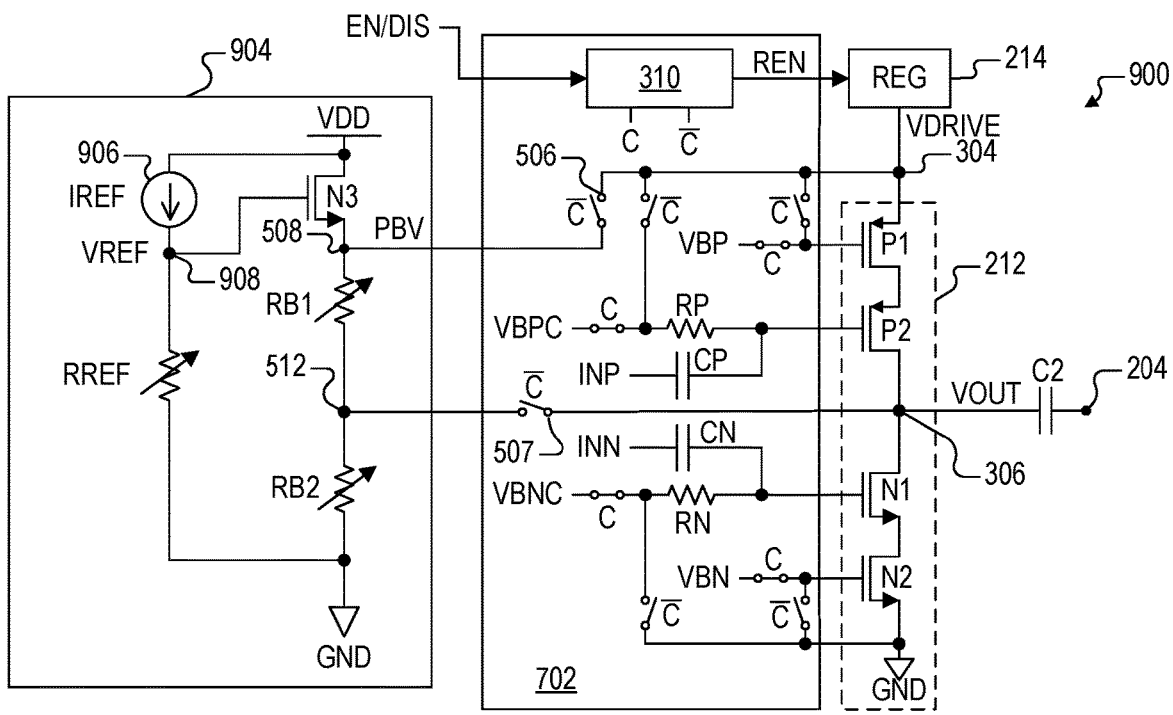
FIG. 9 is a schematic and block diagram of a power amplifier circuit including the disable circuit of FIG. 7 and a bias circuit implemented according to yet another embodiment of the present disclosure.

FIG. 9 is a schematic and block diagram of a PA circuit 900 including the disable circuit 702 and a bias circuit 904 implemented according to yet another embodiment of the present disclosure. The regulator 214 providing the drive voltage VDRIVE, the power switch 304, and the driver 212 are included and coupled in the same manner as shown and described for the PA circuit 700. The disable circuit 702 is included and operates in substantially the same manner as previously described. As before, the disable circuit 702 includes the $\overline{C}$ switch 506 coupled between the source node 304 and the bias voltage node 508 and includes the $\overline{C}$ switch 507 coupled between the intermediate output node 306 and the bias voltage node 512.

The bias circuit 904 includes the bias resistor RB1 coupled between the bias voltage nodes 508 and 512 and the bias resistor RB1 coupled between the bias voltage node 512 and GND in a similar manner as the bias circuit 704. The bias voltage node 508, however, is not coupled to VDD. Instead, the disable circuit 904 includes a reference current source 906, an N-channel reference transistor N3, and a reference resistor RREF. The current source 904 has an input coupled to VDD and has an output coupled to a reference node 908 developing a reference voltage VREF. N3 has its drain terminal coupled to VDD, its gate terminal coupled to reference node 908, and its source terminal coupled to the bias voltage node 508 which develops a bias voltage PBV. RREF is coupled between the reference node 908 and GND. Although not shown, the bias circuit 904 may further include one or more $\overline{C}$ switches to selectively decouple N3, the bias resistors RB1 and RB2, the reference current source 906, and the reference resistor RREF from VDD when the PA 120 is enabled.

The disable circuit 902 operates in substantially the same manner as the disable circuit 702 previously described in the enable mode. In particular, when the PA circuit 900 is used in the PA 120 and when the EN/DIS signal is asserted to its first logic state to enable the PA 120, then the regulator 214 is enabled to provide VDRIVE to the driver 212, VBP is provided to the gate terminal of P1, VBPC is provided through the resistor RP to the gate terminal of P2, INP is provided through the capacitor CP to the gate terminal of P2, INN is provided through the capacitor CN to the gate terminal of N1, VBNC is provided through the resistor RN to the gate terminal of N1, and VBN is provided to the gate terminal of N2. The $\overline{C}$ switch 506 removes VDD at the bias voltage node 508 from the source node 304 and the $\overline{C}$ switch 507 decouples the bias voltage node 512 from the intermediate output node 306. If the PA circuit 900 is used within the PA 120, then when the RF transceiver 102 is ready to transmit a signal, the transmitter circuit 118 develops the INP and INN transmit signals and the EN/DIS signal is asserted to enable the PA 120.

When the PA circuit 900 is used in the PA 120 and when the EN/DIS signal is asserted to its second logic state to enable the PA 120, then the regulator 214 is disabled to remove VDRIVE from the source node 304, the signals VBP, VPBC, INP, INN, VBNC, and VBN are decoupled from the driver 212, the source node 304 is coupled to the bias voltage node 508 developing the voltage PBV, and the intermediate output node 306 is coupled to the bias voltage node 512 developing a bias voltage based on PBV and the relative resistances of RB1 and RB2. Rather than PBV varying based on VDD, N3 maintains PBV at a stable bias voltage level regardless of variations of VDD. In particular, N3, the reference current source 906, and the reference resistor RREF form a source-follower circuit to control the voltage level of PBV. The reference current source 906 delivers a stable current level IREF through RREF to establish VREF at a steady and stable voltage level, which controls N3 to drive PBV at a steady and stable voltage level.

Figure 10:
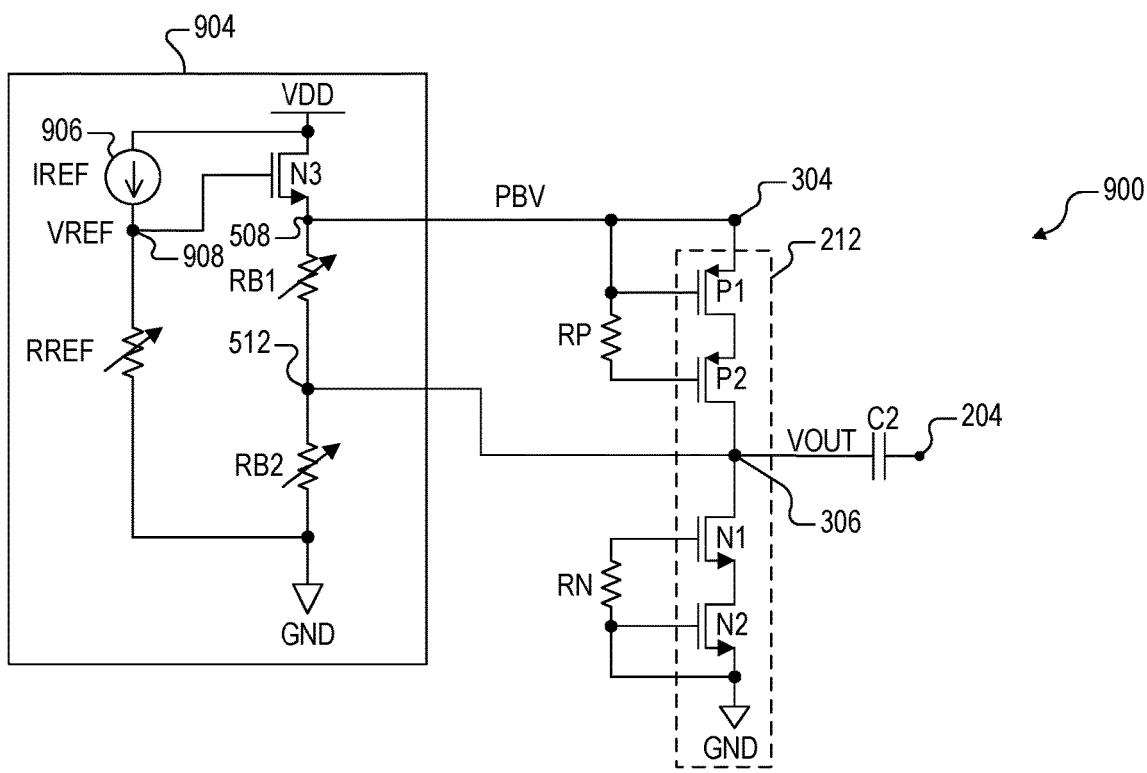
FIG. 10 is a schematic diagram illustrating an electrical equivalent of the power amplifier circuit of FIG. 9 when used in the power amplifier of FIG. 1 and when an enable signal is asserted to disable the driver of the power amplifier according to one embodiment of the present disclosure.

FIG. 10 is a schematic diagram illustrating an electrical equivalent of the PA circuit 900 when used in the PA 120 and when EN/DIS is asserted to its second state to disable the driver 212 according to one embodiment of the present disclosure. Operation of the bias circuit 904 is similar to operation of the bias circuit 704 except that variation of the supply voltage VDD does not significantly impact the voltage level of PBV, so that the bias voltage levels of the nodes 304 and 306 remain substantially unmodified. In particular, the voltage levels of the source node 304 and the intermediate output node 306 are controlled by a NMOS source-follower within the bias circuit 904. The input of the source follower, which is the gate terminal of N3, receives VREF generated by IREF flowing through RREF. The resistance of RREF may be adjustable (or programmable) to adjust the voltage level of PBV. In this manner, the reference level can be set much more precisely than when using the supply voltage VDD, and thus the operation of the bias circuit 904 is less prone to the supply voltage variation.

In addition, the disable circuit 702 using the bias circuit 904 provides better control of the leakage current if it becomes an issue for a given configuration. The bias voltage PBV at the output of the source-follower at the bias voltage node 508 is divided by the adjustable resistor array (RB1 and RB2) to set up the biasing voltage level of the intermediate output node 306 at the bias voltage node 512. In a similar manner as previously described, the PA circuit 900 using the disable circuit 704 and the bias circuit 904 enables the receiver circuit 114 to have a significantly greater chance of receiving the desired signal 104 as compared to a conventional configuration.

In yet other embodiments, although not specifically shown, a complementary implementation may be configured using a PMOS source follower or a combination of NMOS and PMOS source followers.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A power amplifier for a radio frequency transceiver, comprising:
    a driver comprising at least one P-channel transistor and at least one N-channel transistor having current terminals coupled between a source node and a supply ground node forming an intermediate output node;
    a first switch circuit that couples a control input of the at least one N-channel transistor to the supply ground node in a disable mode;
    a second switch circuit that couples a control input of the at least one P-channel transistor to the source node in the disable mode;
    a bias circuit comprising a first bias voltage node and a second bias voltage node wherein a voltage level of the second bias voltage node is greater than a voltage level of the supply ground node and wherein a voltage level of the first bias voltage node is greater than the voltage level of the second bias voltage node in the disable mode; and
    a third switch circuit that couples the source node to the first bias voltage node and that couples the intermediate output node to the second bias voltage node in the disable mode.

2. The power amplifier of claim 1, wherein the voltage levels of the first and second bias voltage nodes are sufficient to minimize impact of a blocker signal detected at the intermediate output node when received by the radio frequency transmitter.

3. The power amplifier of claim 1, wherein the bias circuit further comprises a first bias resistor coupled between the first bias voltage node and the second bias node and a second bias resistor coupled between the second bias node and the supply ground node in the disable mode.

4. The power amplifier of claim 3, wherein the first bias voltage node is coupled to receive a supply voltage.

5. The power amplifier of claim 3, wherein at least one of the first and second bias resistors is adjustable.

6. The power amplifier of claim 1, wherein the bias circuit further comprises:
    a first bias resistor coupled between the first bias voltage node and the second bias node and a second bias resistor coupled between the second bias node and the supply ground node in the disable mode;
    a reference node;
    a current source that provides a reference current to the reference node in the disable mode;
    a reference resistor coupled between the reference node and the supply ground node in the disable mode; and
    a reference transistor having a control terminal coupled to the reference node, having a first current terminal coupled to a supply voltage and having a second current terminal coupled to the first bias voltage node in the disable mode.

7. The power amplifier of claim 6, wherein the reference resistor is adjustable.

8. The power amplifier of claim 6, wherein at least one of the first and second bias resistors is adjustable.

9. The power amplifier of claim 6, wherein the voltage level of the reference node is adjusted to control the reference transistor to drive the first bias voltage node to a voltage level sufficient to minimize impact of a blocker signal received by the radio frequency transceiver and detected at the intermediate output node.

10. The power amplifier of claim 1, further comprising a first voltage source having an output driving the first bias voltage node to a first bias voltage level and a second voltage source having an output driving the second bias voltage node to a second bias voltage level in the disable mode.

11. A method of disabling a power amplifier of a radio frequency transceiver, the power amplifier including at least one P-channel transistor and at least one N-channel transistor having current terminals coupled between a source node and a supply ground node forming an intermediate output node, the method comprising:
- coupling a control input of the at least one N-channel transistor to the supply ground node in a disable mode;
- coupling a control input of the at least one P-channel transistor to the source node in the disable mode;
- coupling the source node to a first bias voltage node having a voltage level that is greater than a voltage level of the supply ground node in the disable mode; and
- coupling the intermediate output node to a second bias voltage node having a voltage level that is between the voltage levels of the first bias voltage node and the supply ground node in the disable mode.

12. The method of claim 11, further comprising charging the first and second bias voltage nodes during the disable mode to corresponding voltage levels that are sufficient to minimize impact of a blocker signal detected at the intermediate output node when received by the radio frequency transmitter.

13. The method of claim 11, further comprising coupling a first bias resistor between the first bias voltage node and the second bias voltage node and coupling a second bias resistor between the second bias voltage node and the supply ground node in the disable mode.

14. The method of claim 13, further comprising coupling the first bias voltage node to receive a supply voltage in the disable mode.

15. The method of claim 13, further comprising adjusting at least one of the first and second bias resistors to select a voltage level of the intermediate output node in the disable mode.

16. The method of claim 1, further comprising:
- coupling a first bias resistor between the first bias voltage node and the second bias voltage node and coupling a second bias resistor between the second bias voltage node and the supply ground node in the disable mode;
- providing a reference current to a reference node and coupling a reference resistor between the reference node and the supply ground node in the disable mode; and
- providing a source-follower transistor that is controlled by a voltage level of the reference node to control a voltage level of the first bias voltage node in the disable mode.

17. The method of claim 16, further comprising adjusting the reference resistor to select a voltage level of the reference node in the disable mode.

18. The method of claim 16, further comprising adjusting at least one of the first and second bias resistors to select a voltage level of the intermediate output node in the disable mode.

19. The method of claim 16, further comprising adjusting the voltage level of the reference node to control the reference transistor to drive the first and second bias voltage nodes to corresponding voltage levels sufficient to minimize impact of a blocker signal received by the radio frequency transceiver and detected at the intermediate output node.

20. The method of claim 11, further comprising:
- receiving an enable signal indicative of the disable mode;
- removing a drive voltage from the source node when the enable signal indicates the disable mode; and
- controlling the coupling of the control terminals of the at least one N-channel transistor and the at least one P-channel transistor based on the enable signal.

* * * * *